US010325836B1

(12) United States Patent
Rigoni et al.

(10) Patent No.: US 10,325,836 B1
(45) Date of Patent: Jun. 18, 2019

(54) INTEGRATED CIRCUIT WITH CONNECTIVITY ERROR DETECTION

(71) Applicant: Allegro MicroSystems, LLC, Manchester, NH (US)

(72) Inventors: Nicolas Rigoni, Buenos Aires (AR); Juan Manuel Cesaretti, Ciudad de Buenos Aires (AR); Brian Bernier, Nottingham, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/034,660

(22) Filed: Jul. 13, 2018

(51) Int. Cl.
| | | |
|---|---|---|
| *H01L 23/495* | (2006.01) | |
| *H01L 23/31* | (2006.01) | |
| *H03K 17/567* | (2006.01) | |
| *H01L 23/00* | (2006.01) | |
| *H01L 23/055* | (2006.01) | |
| *H03K 5/24* | (2006.01) | |
| *H01L 21/66* | (2006.01) | |

(52) U.S. Cl.
CPC ......... *H01L 23/4952* (2013.01); *H01L 22/32* (2013.01); *H01L 23/055* (2013.01); *H01L 23/49524* (2013.01); *H01L 24/48* (2013.01); *H03K 5/24* (2013.01); *H01L 2224/48245* (2013.01)

(58) Field of Classification Search
CPC ............ H01L 23/495; H01L 23/49575; H01L 23/055; H01L 23/057; H01L 23/60; H01L 21/563; H01L 22/32; H01L 24/48; H01L 24/481
See application file for complete search history.

(56) References Cited

U.S. PATENT DOCUMENTS

| | | | |
|---|---|---|---|
| 9,355,950 B1 * | 5/2016 | Bayerer | ............ H01L 23/49833 |
| 9,941,224 B2 | 4/2018 | Lamar et al. | |
| 10,078,110 B2 * | 9/2018 | Yun | ....................... G01R 31/025 |
| 2017/0250143 A1 | 8/2017 | Wilkinson et al. | |
| 2018/0061820 A1 | 3/2018 | Klebanov et al. | |

* cited by examiner

*Primary Examiner* — An T Luu
(74) *Attorney, Agent, or Firm* — Daly, Crowley, Mofford & Durkee, LLP

(57) ABSTRACT

An integrated circuit with transmission line error detection comprises a substrate, a package enclosing the substrate, a lead extending from the inside of the package to the outside of the package, and a circuit supported by the substrate. The circuit includes an input circuit and an output circuit. A first wire is coupled between the output circuit and the lead and a second wire is coupled between the lead and the input circuit so that the input circuit receives a signal generated by the output circuit after the signal has been transmitted across the first and second wires.

18 Claims, 5 Drawing Sheets

US 10,325,836 B1

INTEGRATED CIRCUIT WITH CONNECTIVITY ERROR DETECTION

FIELD

This disclosure relates to integrated circuits and fault detection.

BACKGROUND

Integrated circuits contain a semiconductor die enclosed in a package. Leads extend from inside the package to outside the package. Bond wires are coupled to bond pads on the semiconductor die and to the leads so that electrical connections can be made from the semiconductor die to circuits external to the package.

Some industries, especially industries like the automotive industry that have stringent safety standards, require that integrated circuits contain robust error detection. However, breaks in bond wires, bond wire connections, solder connections between the chip and a circuit board, and the like may be difficult to detect, especially if the signal carried by those connections is an output signal of the integrated circuit chip.

SUMMARY

In an embodiment, an apparatus comprises a substrate, a package enclosing the substrate, a lead extending from the inside of the package to the outside of the package, and a circuit supported by the substrate. The circuit includes an input circuit and an output circuit. A first wire is coupled between the output circuit and the lead and a second wire is coupled between the lead and the input circuit so that the input circuit receives a signal generated by the output circuit after the signal has been transmitted across the first and second wires.

In another embodiment, an apparatus includes a substrate, a package enclosing the substrate; a first lead extending from the inside of the package to the outside of the package, a second lead extending from the inside of the package to the outside of the package, and a circuit board supporting the package and comprising a board-level circuit that couples the first lead to the second lead. The circuit includes an input circuit and an output circuit. A first wire is coupled between the output circuit and the first lead and a second wire is coupled between the second lead and the input circuit so that the input circuit receives a signal generated by the output circuit after the signal has been transmitted across the first and second wires.

In another embodiment, an apparatus comprises a semiconductor die, a package enclosing the semiconductor die, a lead extending from the inside of the package to the outside of the package, an integrated circuit supported by the semiconductor die, and means for determining if one or more lead wires coupled between the integrated circuit and the lead are broken.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
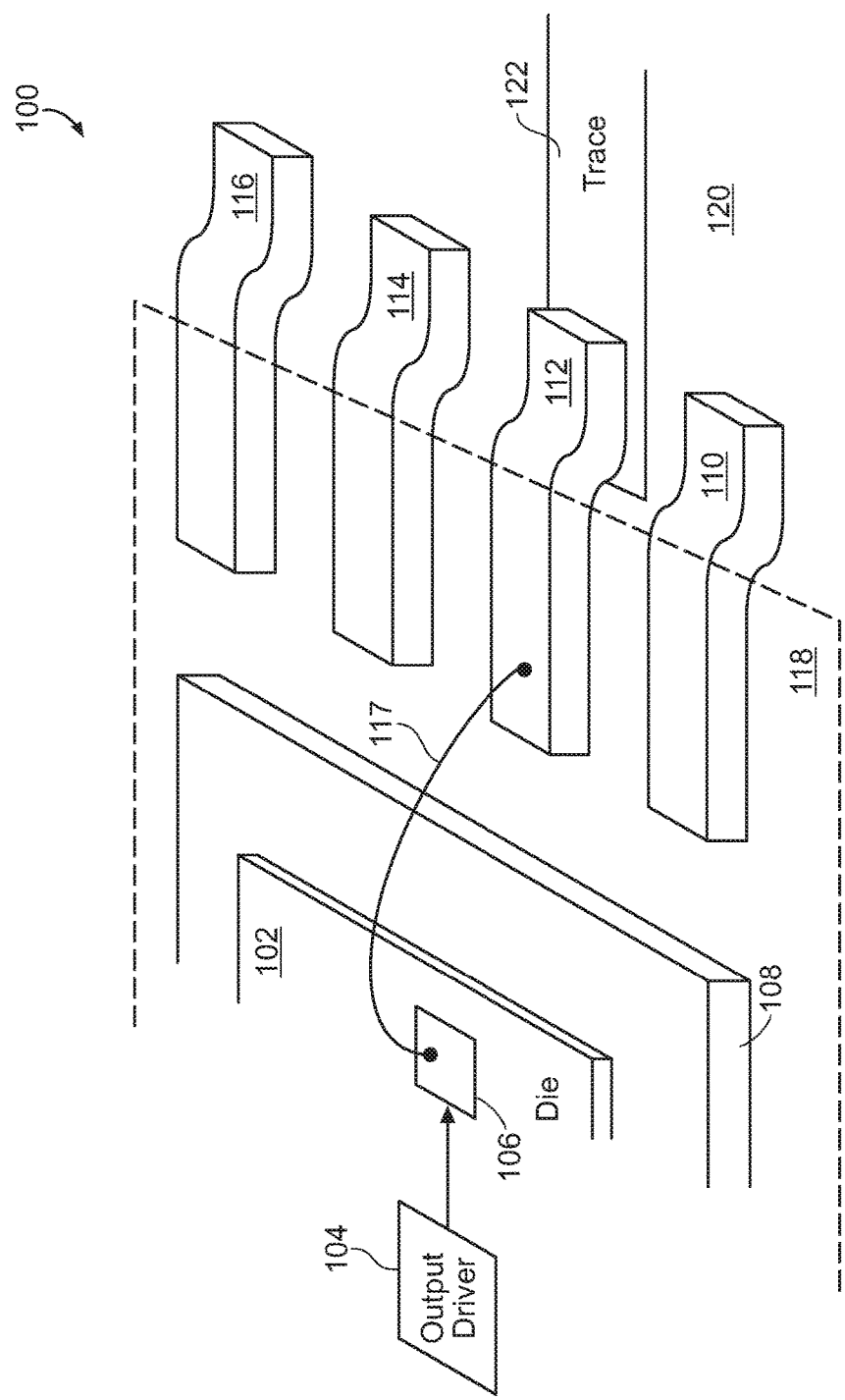
FIG. 1 is a diagram of an integrated circuit of the prior art.

FIG. 1 is a diagram of an integrated circuit (IC) 100 of the prior art. IC 100 includes a substrate 102 that supports circuits. Output driver 104 is an example of a circuit supported by substrate 102. Substrate 102 may be a semiconductor chip or die including, but not limited to a silicon semiconductor, a ceramic semiconductor, a glass semiconductor, etc.

Substrate 102 may also include one or more bond pads 106 that can be used as contacts for connection to external circuits.

Substrate 102 may be supported by a package frame or lead frame 108, which may be a structure on which substrate 102 sits. In embodiments, an adhesive may adhere substrate 102 to package frame 108.

IC 100 also includes a plurality of conductive leads 110-116 which may be integrally formed with package frame 108 and a package 118. Leads 110 and 116 may extend from the inside to the outside of package 118 to provide external circuits with electrical connection points to IC 100. Bond wire 117 may be coupled between lead 112 and bond pad 106 to connect lead 112 to circuit 104. Although not shown, bond wires may connect leads 110, 114, and 116 to other bond pads on substrate 102.

Chip 100 may be mounted on a substrate 120. In embodiments, substrate 120 is a printed circuit board ("PCB") having one or more traces 122 that can be electrically connected to leads 110-116. In the example in FIG. 1, chip 100 is a surface mount chip and lead 112 is a surface mount lead soldered to trace 122. Substrate 120 may be a fiberglass, glass, flex, or other type of substrate used to support integrated circuits and other circuits.

In embodiments, package 118 may be any type of chip package known in the industry including, but not limited to, a surface mount package, a through-hole package, a chip-on-board package, a ball grid array package, and the like. Accordingly, leads 110-116 may be any type of connector that provides connection from inside the package to outside the package including, surface mount leads, through hole leads, ball leads, chip-on-board leads, and the like. Other types of packages and leads known in the industry are also included within the scope of this patent.

In embodiments, it may be difficult or impossible to determine if bond wire 117 is broken. Output driver 104 may drive output signals that are propagated through bond pad 106, bond wire 117, lead 112, and trace 122. However, if bond wire 117 is broken, chip 100 (e.g. the circuits within chip 100) have no way to detect the fault.

Figure 2:
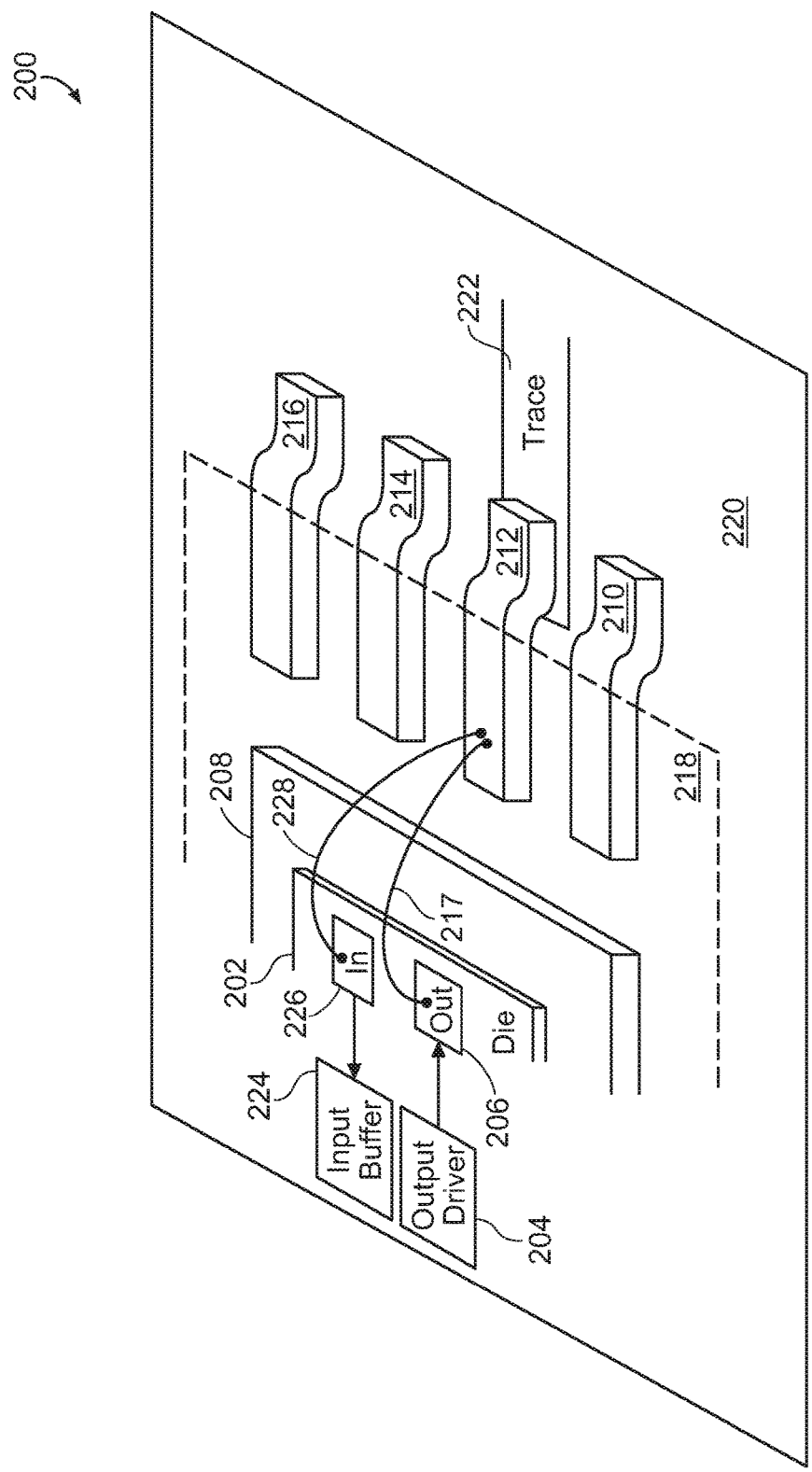
FIG. 2 is a diagram of an integrated circuit.

Referring to FIG. 2, chip 200 includes a substrate 202 that supports integrated circuits. Output driver 204 is an example of a circuit supported by substrate 202. Substrate 202 may be a semiconductor die including, but not limited to a silicon semiconductor, a ceramic semiconductor, a glass semiconductor, etc.

Substrate 202 may also include one or more bond pads 206 that can be used as contacts for connection to external circuits.

Substrate 202 may be supported by a package frame or lead frame 208, which may be a structure on which substrate 202 sits. In embodiments, an adhesive may adhere substrate 202 to package frame 208.

Chip 200 also includes a plurality of conductive leads 210-216 and a package 218. Leads 210-216 may extend from the inside to the outside of package 218 to provide external circuits with electrical connection points to chip 200. Bond wire 217 may be coupled between lead 212 and bond pad 206 to connect lead 212 to circuit 204. Although not shown, bond wires may connect leads 210, 214, and 216 to other bond pads on substrate 202.

Chip 200 may be mounted on a substrate 220. In embodiments, substrate 220 is a printed circuit board ("PCB") having one or more traces 222 that can be electrically connected to leads 210-216. In the example in FIG. 2, chip 200 is a surface mount chip and lead 212 is a surface mount lead soldered to trace 222.

In embodiments, package 218 may be any type of chip package known in the industry including, but not limited to, a surface mount package, a through-hole package, a chip-on-board package, a ball grid array package, and the like. Accordingly, leads 210-216 may be any type of connector that provides connection from inside the package to outside the package including, surface mount leads, through hole leads, ball leads, chip-on-board leads, and the like. Other types of packages and leads known in the industry are also included within the scope of this patent.

Chip 200 may also include an input circuit 224 coupled to a second bond pad 226. A second bond wire 228 may be coupled between bond pad 226 and lead 212. Because bond wire 228 and bond wire 217 are coupled to the same lead 212, input circuit 224 can receive the signal that output driver 204 is driving onto lead 212. If input circuit 224 receives the same signal that output driver 204 sends, it may indicate that lead wires 217 and 228 are not broken. On the other hand, if input circuit 224 does not receive the same signal, then it may indicate that there is a break in one or both of lead wires 217 and 228. Chip 200 may include circuitry to detect whether input circuit 224 receives the same signal sent by output driver 204 and raise an error if the signals do not match or differ by more than predetermined amount.

Figure 3:
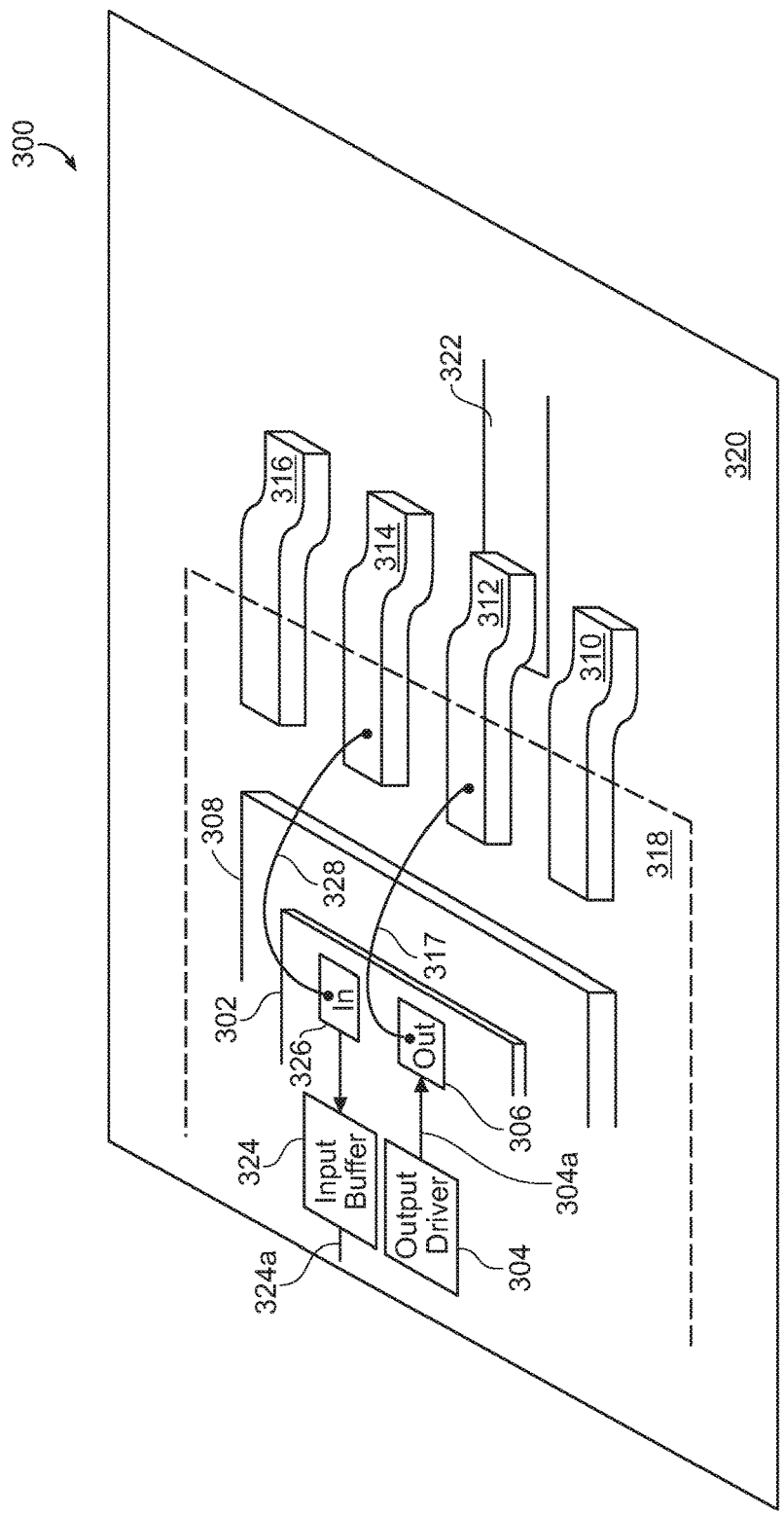
FIG. 3 is a diagram of another embodiment of an integrated circuit.

FIG. 3 is a diagram of chip 300 which includes a substrate 302 that supports circuits. Output driver 304 is an example of a circuit supported by substrate 302. Substrate 302 may be a semiconductor die including, but not limited to a silicon semiconductor, a ceramic semiconductor, a glass semiconductor, etc.

Substrate 302 may also include one or more bond pads 306 that can be used as contacts for connection to external circuits.

Substrate 302 may be supported by a package frame or lead frame 308, which may be a structure on which substrate 302 sits. In embodiments, an adhesive may adhere substrate 302 to package frame 308.

Chip 300 also includes a plurality of conductive leads 310-316 and a package 318. Leads 310 and 316 may extend from the inside to the outside of package 318 to provide external circuits with electrical connection points to chip 300. Bond wire 317 may be coupled between lead 312 and bond pad 306 to connect lead 312 to circuit 304. Bond wire 328 may be coupled between lead 314 and bond pad 326 to connect lead 314 to circuit 324. Additional bond wires (not shown) may connect leads 310 and 316 to other bond pads on substrate 302.

Chip 300 may be mounted on a substrate 320. In embodiments, substrate 320 is a printed circuit board ("PCB") having one or more traces 322 that can be electrically connected to leads 310-316. As shown in FIG. 3, trace 322 may be coupled to both lead 312 and lead 314.

In embodiments, package 318 may be any type of chip package known in the industry including, but not limited to, a surface mount package, a through-hole package, a chip-on-board package, a ball grid array package, and the like. Accordingly, leads 310-316 may be any type of connector that provides connection from inside the package to outside the package including, surface mount leads, through hole leads, ball leads, chip-on-board leads, and the like. Other types of packages and leads known in the industry are also included within the scope of this patent.

Chip 300 may also include an input circuit 324 coupled to a second bond pad 326. A second bond wire 328 may be coupled between bond pad 326 and lead 314. On PCB 320, trace 322 may be coupled between leads 312 and 314. In this arrangement, both leads 312 and 314 may be soldered or otherwise electrically connected to trace 322. Alternatively, leads 312 and 314 may be soldered to different, separate traces that are shorted together at another location.

Trace 322 provides a short circuit between output driver 304 and input buffer 324. As long as bond wires 317 and 328, the solder connection between lead 312 and trace 322, and the solder connection between lead 314 and trace 322 are not broken, input buffer 324 will receive the same signal produced by output driver 304. On the other hand, if input circuit 324 does not receive the same signal, then it may indicate that there is a break in bond wire 317, bond wire 328, the solder connection between lead 312 and trace 322, and/or the solder connection between lead 314 and trace 322. Chip 300 may also include circuitry to detect whether input circuit 324 receives the same signal sent by output driver 304 and raise an error if the signals do not match or differ by more than predetermined amount.

Figure 4:
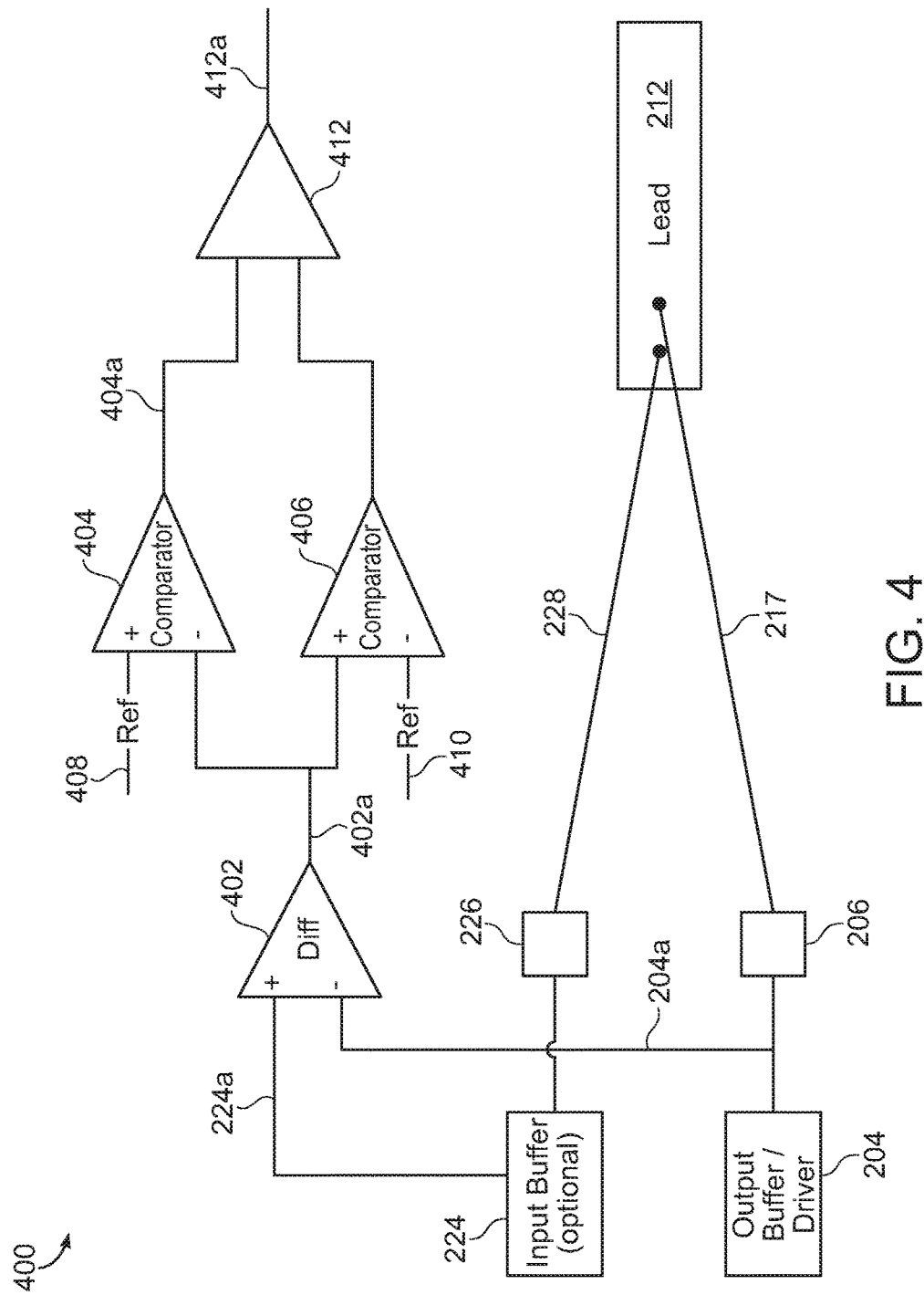
FIG. 4 is a schematic diagram of a circuit to detect a fault in an integrated circuit.

FIG. 4 is a schematic diagram of circuit 400 associated with chip 200. The diagram includes lead 212, lead wires 217 and 228, bond pads 206 and 226, output driver 204, and input buffer 224.

Circuit 400 also includes circuit elements to determine if there is a break in bond wire 217 and/or 228 and/or in a connection between one or both bond wires 217, 228 and lead 212. These circuit elements include difference circuit 402, comparator 404, and comparator 406. In the example shown in FIG. 4, input buffer 224 may be optional. In the case where input buffer 224 is omitted, the positive input terminal of difference circuit 402 may be coupled directly to bond pad 226.

Circuit 400 may be suitable in the case where signal 204a (the output of output driver 204) is an analog signal. In this example, difference circuit 402 and comparators 404 and 406 may be analog circuits. If both bond wire 217 and 228 are unbroken, then signal 204a should match signal 224a. In this case, the output signal 402a of difference circuit 402 may be approximately zero volts. If, however, either bond wire 217 or 228 is broken, signals 204a and 224a will not match. In this case, signal 402a will be non-zero.

Comparator 404 may compare signal 402a to a high reference signal 408 and comparator 406 may compare signal 402a to a low reference signal 410. Under normal conditions when there is no fault, the signal 402a will be lower than the high reference signal 408 and signal 402a will be higher than the low sequence signal 410. If the value of signal 402a becomes higher than the value of high reference signal 408, comparator 404 may cause signal 404a to become high. This may cause OR circuit 412 to drive output signal 412a high. Similarly, If the value of signal 402a is lower than the value of low reference signal 410, comparator 406 may cause signal 404a to become high. This may cause OR circuit 412 to drive output signal 412a high. When signal 412a is high, it may indicate that signals 224a and 204a are not the same and that there may be a fault or break in bond wire 217 and/or 228 and/or in a connection between one or both bond wires 217, 228 and lead 212.

In embodiments, difference circuit 402 may be coupled to receive signal 204a at a point between output driver 204 and bond pad 206, and input buffer 224 may be coupled to receive signal 204a after it passes through bond wire 217 and bond wire 228. This may ensure that the signal 402a represents a difference between the signal before and after it passes through bond wires 217 and 228, so that circuit 400 can detect errors or breaks in the bond wires.

One skilled in the art will recognize that circuit 400 may also be used with chip 300 in FIG. 3. In this case, difference circuit 402 may be coupled to receive signal 304a (the output of output driver 304) and signal 324a (the output of input buffer 324). When signal 412a is high, it may indicate a fault or break in bond wire 317, bond wire 328, the solder connection between lead 312 and trace 322, and/or the solder connection between lead 314 and trace 322.

Figure 5:
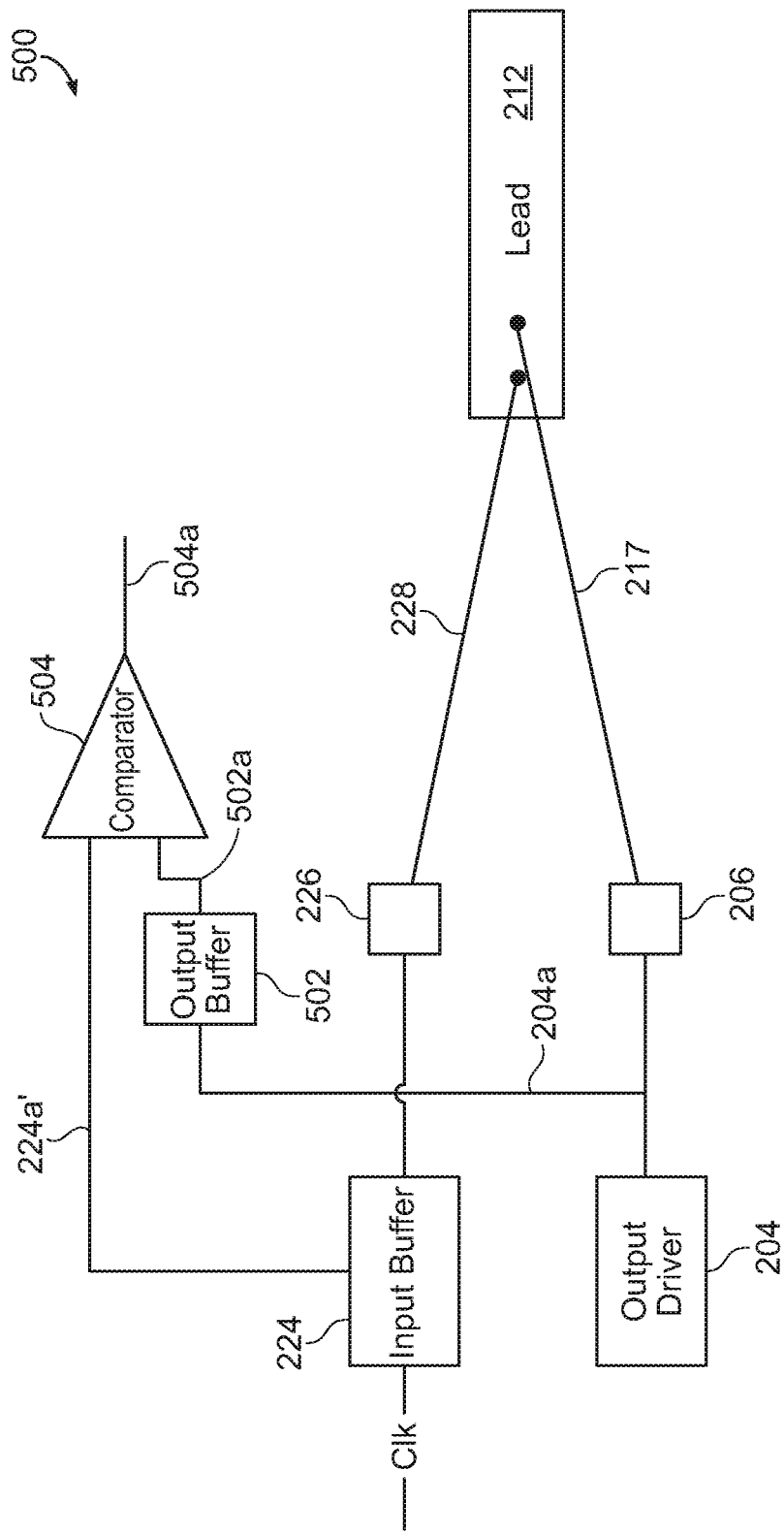
FIG. 5 is a diagram of another embodiment of a circuit to detect a fault in an integrated circuit.

FIG. 5 is a schematic diagram of circuit 500 associated with chip 200. The diagram includes lead 212, lead wires 217 and 228, bond pads 206 and 226, output driver 204, and input buffer 224.

Circuit 500 also includes circuit elements to determine if there is a break in bond wire 217 and/or 228. These circuit elements include output buffer 502 and comparator 504.

Circuit 400 may be suitable in the case where signal 204a (the output of output driver 204) is a digital signal, such as a bit stream, for example. In this example, input buffer 224 and output buffer 502 may be digital buffers that store one or more bits of the bit stream produced by output driver 204. Comparator 504 may be a digital comparator that can compare the digital content (e.g. digital values such as signal 224a' and signal 502a) that are stored in output buffer 502 and input buffer 224. If both bond wire 217 and 228 are unbroken, then signal 224a' should match signal 502a. In this case, the output signal 504a of comparator 504 may indicate that no error was found. If, however, either or both bond wire 217 or 228 are broken, signals 224a' and 502a will not match. In this case, signal 504a may indicate an error.

In embodiments, output buffer 502 may be coupled to receive signal 204a at a point between output driver 204 and bond pad 206, and input buffer 224 may be coupled to receive signal 204a after it passes through bond wire 217 and bond wire 228. This may ensure that the signals being compared by comparator 504 represent the signal before and after it passes through the bond wires, so that circuit 500 can detect errors or breaks in the bond wires.

One skilled in the art will recognized that circuit 500 may also be used with chip 300 in FIG. 3. In this case, if signals 224a' and 502a do not match, it may indicate a fault or break in bond wire 317, bond wire 328, the solder connection between lead 312 and trace 322, and/or the solder connection between lead 314 and/or trace 322.

Various embodiments are described above. However, other embodiments incorporating these concepts, structures and techniques may be used. Accordingly, the scope of the patent should not be limited to the described embodiments but rather should be limited only by the spirit and scope of the following claims. All references cited in this patent are incorporated by reference in their entirety.

The invention claimed is:

1. An apparatus comprising:
   a substrate;
   a package enclosing the substrate;
   a lead extending from the inside of the package to the outside of the package;
   a circuit supported by the substrate, the circuit comprising an input circuit and an output circuit;
   a first wire coupled between the output circuit and the lead; and a second wire coupled between the lead and the input circuit so that the input circuit receives a signal generated by the output circuit after the signal has been transmitted across the first and second wires.

2. The apparatus of claim 1 further comprising a comparator circuit coupled to the input circuit and the output circuit to compare the signal generated by the output circuit to the signal received by the input circuit to determine if the first and/or second wire is broken.

3. The apparatus of claim 1 wherein the lead is a through-hole lead, a surface-mount lead, or a ball lead.

4. The apparatus of claim 1 wherein the package is a chip-on-substrate package and the lead comprises a trace on the substrate.

5. The apparatus of claim 2 further comprising a difference circuit coupled to receive the signal generated by the output circuit and the signal received by the input circuit and produce a difference signal representing a difference between the signal generated by the output circuit and the signal received by the input circuit.

6. The apparatus of claim 5 wherein the comparator circuit is coupled to receive the difference signal and a reference voltage, and the apparatus is configured to generate an error signal if the difference signal is greater than the reference voltage.

7. The apparatus of claim 2 wherein the output circuit comprises an output buffer to store a copy of the signal generated by the output circuit.

8. The apparatus of claim 7 wherein the comparator circuit is configured to compare the signal received by the input circuit to the copy of the signal generated by the output circuit.

9. The apparatus of claim 2 wherein the input circuit comprises an input buffer, the output circuit comprises an output buffer, and the comparator circuit is configured to compare a value stored in the input buffer to a value stored in the output buffer.

10. An apparatus comprising:
a substrate;
a package enclosing the substrate;
a first lead extending from the inside of the package to the outside of the package;
a second lead extending from the inside of the package to the outside of the package;
a circuit board supporting the package and comprising a board-level circuit that couples the first lead to the second lead; and
a circuit supported by the substrate, the circuit comprising an input circuit and an output circuit;
a first wire coupled between the output circuit and the first lead; and
a second wire coupled between the second lead and the input circuit so that the input circuit receives a signal generated by the output circuit after the signal has been transmitted across the first and second wires.

11. The apparatus of claim 10 wherein the board-level circuit is a trace that shorts the first lead to the second lead.

12. The apparatus of claim 10 further comprising a comparator circuit coupled to the input circuit and the output circuit to compare the signal generated by the output circuit to the signal received by the input circuit to determine if the first and/or second wire is broken.

13. The apparatus of claim 12 further comprising a difference circuit coupled to receive the signal generated by the output circuit and the signal received by the input circuit and produce a difference signal representing a difference between the signal generated by the output circuit and the signal received by the input circuit.

14. The apparatus of claim 13 wherein the comparator circuit is coupled to receive the difference signal and a reference voltage, and the apparatus is configured to generate an error signal if the difference signal is greater than the reference voltage.

15. The apparatus of claim 10 wherein the output circuit comprises an output buffer to store a copy of the signal generated by the output circuit.

16. The apparatus of claim 15 further comprising a comparator circuit configured to compare the signal received by the input circuit to the copy of the signal generated by the output circuit.

17. The apparatus of claim 10 wherein the input circuit comprises an input buffer, the output circuit comprises an output buffer, and the comparator circuit is configured to compare a value stored in the input buffer to a value stored in the output buffer.

18. An apparatus comprising:
a semiconductor die;
a package enclosing the semiconductor die;
a lead extending from the inside of the package to the outside of the package;
a circuit supported by the semiconductor die; and
means for determining if one or more wires coupled between the circuit and the lead are broken.

* * * * *